(12) United States Patent
Kang

(10) Patent No.: US 8,631,761 B2
(45) Date of Patent: Jan. 21, 2014

(54) MASK FRAME ASSEMBLY FOR THIN-FILM DEPOSITION

(75) Inventor: Taek-Kyo Kang, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 13/430,874

(22) Filed: Mar. 27, 2012

(65) Prior Publication Data

US 2012/0325143 A1   Dec. 27, 2012

(30) Foreign Application Priority Data

Jun. 21, 2011   (KR) ........................ 10-2011-0060229

(51) Int. Cl.
*C23C 16/00*   (2006.01)
(52) U.S. Cl.
USPC ............................ 118/504; 118/720; 118/721
(58) Field of Classification Search
USPC .................................. 118/504, 505, 720, 721
See application file for complete search history.

(56) References Cited

U.S. PATENT DOCUMENTS

| | | | |
|---|---|---|---|
| 3,241,519 A | * | 3/1966 | Lloyd ............................ 118/504 |
| 7,006,202 B2 | | 2/2006 | Byun et al. |
| 2010/0192856 A1 | * | 8/2010 | Sung et al. .................... 118/504 |
| 2010/0206222 A1 | | 8/2010 | Sung et al. |

FOREIGN PATENT DOCUMENTS

| | | | |
|---|---|---|---|
| JP | 2004335382 A | * | 11/2004 |
| JP | 2007291461 A | * | 11/2007 |
| JP | 2008-156686 | | 7/2008 |
| KR | 2003-0069684 | | 8/2003 |
| KR | 10-2006-0055619 A | | 5/2006 |
| KR | 10-2010-0090070 | | 8/2010 |
| KR | 10-2010-0094802 | | 8/2010 |
| KR | 20-2010-0008826 A | | 9/2010 |

\* cited by examiner

*Primary Examiner* — Dah-Wei Yuan
*Assistant Examiner* — Binu Thomas
(74) *Attorney, Agent, or Firm* — Lee & Morse, P.C.

(57) ABSTRACT

Provided is a mask frame assembly for thin-film deposition. The mask frame assembly including a mask frame having an opening defined therethrough, the mask frame configured to retain a mask, at least one supporter configured to contact the mask for supporting the mask, and a fixing unit coupled to the supporter and the mask frame.

27 Claims, 6 Drawing Sheets

MASK FRAME ASSEMBLY FOR THIN-FILM DEPOSITION

CROSS-REFERENCE TO RELATED PATENT APPLICATION

This application claims the benefit of Korean Patent Application No. 10-2011-0060229, filed on Jun. 21, 2011, in the Korean Intellectual Property Office, the disclosure of which is incorporated herein in its entirety by reference.

BACKGROUND

1. Field

Embodiments relate to a mask frame assembly for thin film deposition.

2. Description of the Related Art

Conventionally, organic light-emitting display (OLED) apparatuses having thin-film transistors (TFTs) have been applied to electronic and electrical products such as digital cameras, video cameras, camcorders, portable information terminals, smart phones, ultra thin-film televisions, ultra slim notebooks, tablet personal computers, or flexible displays.

An OLED apparatus realizes colors through emitting light by recombining holes and electrons respectively injected from an anode electrode and a cathode electrode into an organic light-emitting layer. The OLED apparatus has a stacked structure in which the organic light-emitting layer is formed between the anode electrode and the cathode electrode.

However, because a high light emission efficiency may not be obtained by an OLED apparatus having a stacked structure in which the organic light-emitting layer is formed between the anode electrode and the cathode electrode, intermediate layers such as an electron injection layer, an electron transport layer, a hole injection layer, and a hole transport layer may be optionally inserted between the organic light-emitting layer and the anode and cathode electrodes.

SUMMARY

One or more embodiments may provide a mask frame assembly for thin-film deposition including a mask frame having an opening defined therethrough, the mask frame configured to retain a mask, at least one supporter configured to contact the mask for supporting the mask, and a fixing unit coupled to the supporter and the mask frame.

The supporter may extend across the opening of the mask frame.

The supporter may include supporting units extending under the mask and bending units extending from opposing ends of the supporting units, the bending units including at least one bent portion extending below each of the ends of the supporting units.

The mask frame may include a first pair of parallel and opposing frame sides and a second pair of parallel and opposing pair of frame sides extending between and connecting the first pair of parallel and opposing frame sides, the fixing unit may be aligned with the bending units of the supporter, at least one coupling unit may be coupled to the supporter and the fixing unit for coupling the supporter and the fixing unit to each other, and opposing ends of the fixing unit may be coupled to the first pair of frame sides.

The fixing unit may include at least one coupling hole at a position corresponding in position to a respective one of the bending units, and the at least one coupling unit may be coupled to a coupling hole in the bending unit.

The fixing unit may include a plurality of the coupling holes, separated from each other, along a length of the fixing unit at positions corresponding to the bending units of the supporter, and the at least one coupling unit may include a plurality of coupling units, the plurality of coupling unites being coupled to the bending units of the supporter through the coupling holes of the fixing unit.

The fixing unit may include a plurality of the coupling holes separated from each other along the length of the fixing unit, and the plurality of the coupling holes may each be configured to permit the at least one coupling unit to couple with a respective one of the bending units by movement of the coupling unit within a respective one of the coupling holes.

The coupling holes of the fixing unit may be greater in number than the number of the supporters, and the at least one coupling unit may be coupled to a respective one of the bending units through the coupling hole of the fixing unit.

The coupling holes may extend along the length of the fixing unit and may be configured to permit movement of the coupling unit therein, the coupling unit being coupled to the coupling hole of a respective one of the bending units and the coupling hole of the fixing unit.

The first pair of frame sides may include a gap control unit for maintaining a gap corresponding to a space in which the bending units are disposed when the supporter is coupled to the fixing unit.

The gap control unit may be defined by a thickness of the first pair of frame sides, the thickness of the first pair of frame sides being greater than a thickness of the second pair of frame sides.

The mask frame assembly may further include coupling holes at opposing ends of the fixing unit at corresponding in position to coupling grooves in the gap control unit, and the coupling units may be coupled to the coupling grooves in the gap control unit and the coupling holes at the opposing ends of the fixing unit.

The mask may include deposition pattern units spaced apart from each other along a length of the mask, and a plurality of ribs that extend between and connect adjacent deposition pattern units.

The supporter units may be disposed across the opening and under the ribs.

The directions in which the mask and the supporter are disposed may intersect each other.

The mask frame may include a first pair of parallel and opposing frame sides and a second pair of parallel and opposing frame sides that extend between and connect the first pair of frame sides, wherein the first pair of frame sides and the second pair of frame sides surround the opening.

The supporter may be disposed parallel to the first pair of frame sides across the opening.

Opposing ends of the supporter may include bending units having at least one bent portion, the bending units being disposed on the fixing unit, the supporter and the fixing unit being coupled to each other by at least one coupling unit, and opposing ends of the fixing unit being coupled to the first pair of frame sides.

The fixing unit may include coupling holes at positions corresponding to the position of the bending units of the supporter, and a plurality of the coupling units may be coupled to the coupling holes in the bending units of the supporter.

The first pair of frame sides may include a gap control unit that maintains a gap between the second pair of frame sides and the fixing unit, the gap defining a space in which the bending units are disposed.

The gap control unit may be defined by a thickness of the first pair of frame sides, the thickness of the first pair of frame sides being greater than the thickness of the second pair of frame sides.

Opposing ends of the fixing unit may further include coupling holes at positions corresponding to coupling grooves in the gap control unit, and the coupling unit may be coupled to the coupling grooves in the gap control unit through the coupling holes.

The mask may include at least one partitioned mask extending across the opening.

BRIEF DESCRIPTION OF THE DRAWINGS

The above and other features and advantages of the embodiments will become more apparent by describing in detail exemplary embodiments thereof with reference to the attached drawings in which.

DETAILED DESCRIPTION

Figure 1:
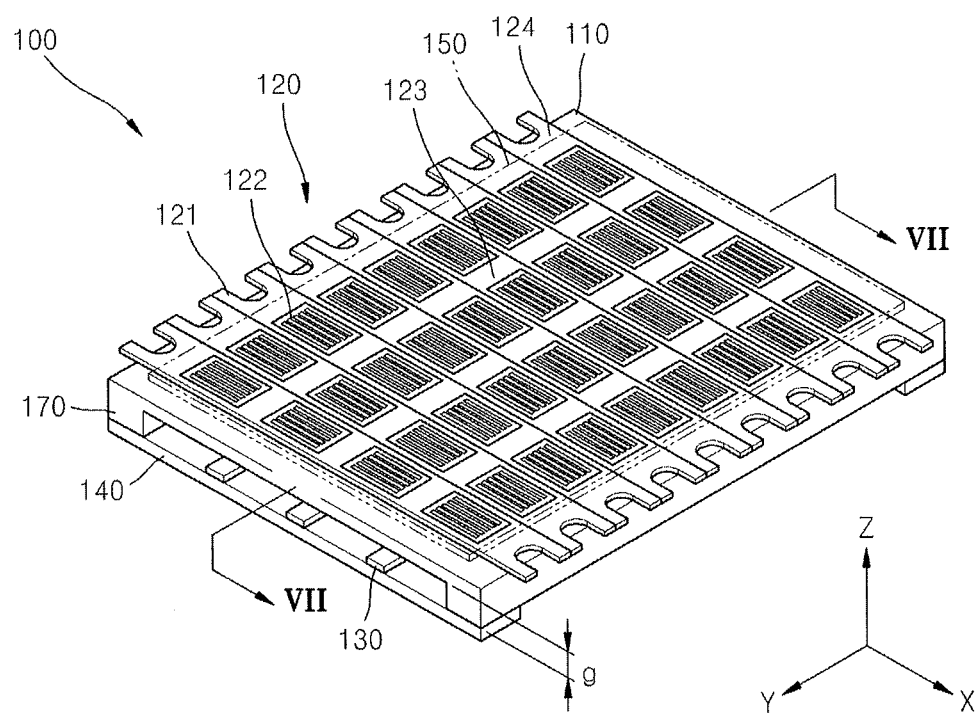
FIG. 1 illustrates a perspective view of a mask frame assembly for thin-film deposition, according to an embodiment.

While exemplary embodiments are capable of various modifications and alternative forms, embodiments thereof are shown by way of example in the drawings and will herein be described in detail. It should be understood, however, that there is no intent to limit exemplary embodiments to the particular forms disclosed, but on the contrary, exemplary embodiments are to cover all modifications, equivalents, and alternatives falling within the scope of the embodiments. In describing the embodiments, when practical descriptions with respect to related known function and configuration may unnecessarily make the scope of the embodiments unclear, the descriptions thereof will be omitted. Like reference numerals in the drawings denote like elements.

It will be understood that, although the terms 'first', 'second', etc. may be used herein to describe various elements, these elements should not be limited by these terms. These terms are only used to distinguish one element from another.

The terminology used herein is for the purpose of describing embodiments only and is not intended to be limiting of exemplary embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Hereinafter, a mask frame assembly for thin-film deposition according to embodiments will be described more fully with reference to the accompanying drawings, in which exemplary embodiments are shown. In describing with reference to drawings, like reference numerals denote like elements or corresponding elements to each other, and thus their description will be omitted.

In a conventional organic light-emitting display (OLED) apparatus, electrodes and an intermediate layer that includes an organic light-emitting layer may be formed by various methods, for example, a photolithography method or a deposition method.

The photolithography method is a wet etching method including coating a photoresist on a region of a substrate. However, the photolithography method may allow moisture to penetrate into an organic light-emitting layer when the photoresist is removed. Accordingly, there is a possibility that performance and lifetime of the manufactured OLED may be greatly degraded.

One method to address the above problem is a deposition method. The deposition method may include aligning a fine metal mask (FMM) having a pattern that is the same as that of a thin-film to be formed on the substrate, then depositing a source material for forming the thin-film, thereby forming a thin-film having a desired pattern.

A deposition mask may be a large mask in which the entire thin-film pattern corresponding to the entire surface of a substrate is formed in a single mask that is combined with a mask frame. When an FMM is large, an etching error for forming a pattern is increased and a phenomenon of sagging of a central portion of the pattern may become severe due to self-weight of the pattern.

Accordingly, a partition type mask has been used recently. A partition type mask may be obtained by partitioning a large mask into several masks having a stick shape and attaching the partitioned masks to a mask frame. However, although the sagging associated with the partition type mask is less than that associated with the large mask, the partition type mask may still produce sagging. Therefore, when the partitioned masks are attached to a mask frame, the partitioned masks may be welded to the mask frame such that the partitioned masks are tautly tensioned in a length direction, e.g., along the length, of the partitioned mask.

However, as the size of OLEDs increase, the welding of the tautly tensioned partitioned masks may not be sufficient to prevent sagging. As such, a central portion of the partitioned masks may sag without bearing of the self-weight of the substrate for deposition. For example, the sagging may not be associated with the weight of the substrate for deposition. Thus, a gap may form in the central portion of the partitioned masks, between the substrate for deposition and the mask frame. Accordingly, a shadow may occur, and the partitioned masks may be disconnected due to the sagging of the central portion of the partitioned mask. Damage may result from the continuous weight of the substrate for deposition. As such the accuracy of the position of a desired pattern may be reduced.

Figure 2:
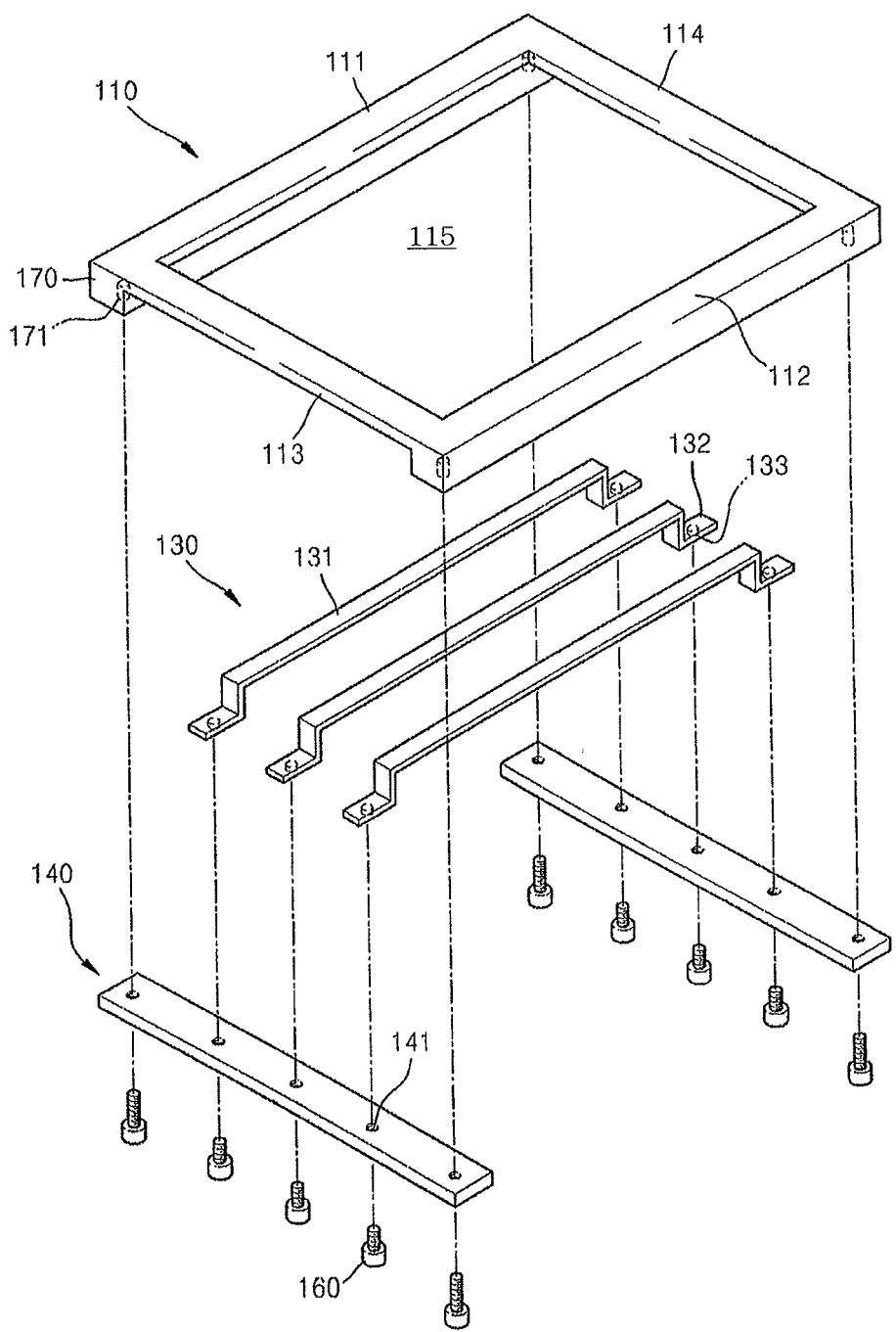
FIG. 2 illustrates an exploded perspective view of the mask frame assembly for thin-film deposition of FIG. 1, in which a mask frame, a supporter, and a fixing unit are separated, according to an embodiment.
Figure 3:
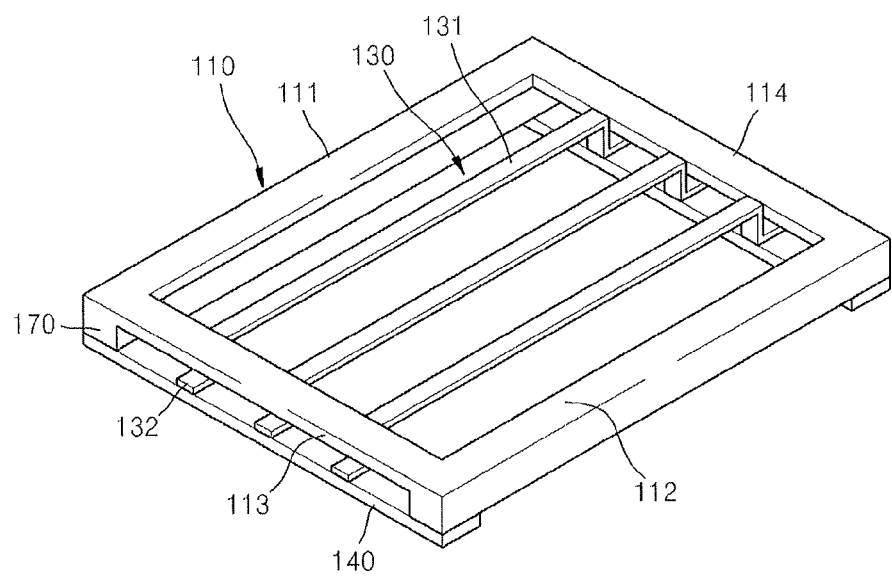
FIG. 3 illustrates a perspective view of the mask frame assembly for thin-film deposition of FIG. 1, in which a mask frame, a supporter, and a fixing unit are combined, according to an embodiment.

FIG. 1 illustrates a perspective view of a mask frame assembly 100 for thin-film deposition, according to an embodiment. FIG. 2 illustrates an exploded perspective view of the mask frame assembly 100 of FIG. 1, in which a mask frame 110, a supporter 130, and a fixing unit 140 are separated. FIG. 3 illustrates a perspective view of the mask frame assembly 100 of FIG. 1, in which the mask frame 110, the supporters 130, and the fixing unit 140 are combined.

Referring to FIGS. 1 through 3, the mask frame assembly 100 may include the mask frame 110, a plurality of masks 120, the supporter 130, and the fixing unit 140.

The mask frame 110 may include an opening 115 define therethrough. The mask frame 110 may have a first pair of opposing frames or frame sides 111 and 112, that extend between and connect a second pair of opposing frames or frame sides 113 and 114.

The first frame 111 and the second frame 112, may face each other in an X direction and may be disposed parallel to each other in a Y direction. The third frame 113 and the fourth frame 114, may face each other in the Y direction and may be disposed parallel to each other in the X direction. The first through fourth frames 111 through 114 may form a square shape.

The mask frame 110 may be formed of a metal which is capable of withstanding welding, e.g., undergoes little deformation, if any, during welding. In other words, the metal may have a high strength.

The mask 120 may be coupled to the mask frame 110. The mask 120 may include a plurality of partitioned masks 121 (separated in the Y direction) instead of a single large mask, to prevent the mask 120 from sagging due to the self-weight of the mask 120, e.g., sagging in a central unsupported portion of the mask. In some embodiments, the partitioned masks 121 may appear as stripes on the mask frame 110. However, the shape of the partitioned masks 121 is not limited to any specific shape, as long as the width of each of the partitioned masks 121 is smaller than a length thereof.

Each of the partitioned masks 121 may include a plurality of deposition pattern units 122 in the length direction of the partitioned mask 121. For example, the plurality of deposition pattern units 122 may extend along a length of the partitioned mask 121. The deposition pattern units 122 may include a plurality of patterned slits. The deposition pattern units 122 may be formed by an electro-forming method to achieve fine patterns and surface planarity.

Alternatively, the deposition pattern units 122 may be formed using an etching method or a laser processing method. When the deposition pattern units 122 are formed using an etching method, a resist layer having the same pattern as the deposition pattern units 122 may be formed on a thin-film using a photoresist, or by etching a thin-film after attaching a film having a pattern to the thin-film.

A plurality of ribs 123 may be formed between adjacent deposition pattern units 122 to connect the adjacent deposition pattern units 122 to each other.

Welding units 124 may be formed on opposing edges of the partitioned mask 121. The welding units 124 may be portions of the partitioned mask 121, which may be welded to the mask frame 110.

The partitioned mask 121 may extend across the opening 115, e.g., in the X direction. The welding units 124 of the partitioned mask 121 may be welded to the first frame 111 and the second frame 112 while a predetermined tension force is applied to the partitioned mask 121 in the X direction. The mask 120 may, thereby, be fixed on the mask frame 110.

High precision patterning using the mask 120 may be performed by reducing a shadow phenomenon. A shadow phenomenon may be reduced by increasing contact between the mask 120 and the substrate 150 that is located on the mask 120. Accordingly, the mask 120 may be formed as a thin-film.

The mask 120 may be formed from a material from the group of stainless steel, invar, nickel, cobalt, nickel alloy, and Ni—Co alloy.

The supporter 130 may be installed to prevent the deformation of the mask 120. At least one supporter 130 may be formed across the opening 115 in the Y direction. The supporter 130 may be installed in a direction intersecting the direction in which the partitioned masks 121 are disposed.

The supporter 130 may include a supporting unit 131 to support the mask 120. In an implementation, the supporting unit 131 may directly contact a lower surface of the mask 120. The supporting units 131 may appear as stripes extending across the mask frame 110. Bending units 132 may be at opposing edges of each of the supporting units 131.

The bending units 132 may include at least one bent portion extending in a downward direction, which is a direction opposite to the installation direction of the mask 120. In some embodiments, although the bending units 132 may be formed by bending the opposing ends of the supporting unit 131 twice to form two bent portions, the number of bent portions is not limited to any specific number, as long as the bending units 132 have a structure in which a step shape may be formed by at least one bend. Each of the bending units 132 may include a coupling hole 133.

The supporter 130 may be disposed under the mask 120 to support the mask 120. In an implementation, the supporter 130 may be located under the ribs 123, between adjacent deposition pattern units 122, so that the supporter 130 does not block the deposition pattern units 122 on the partitioned mask 121. The supporting units 131 may be disposed under the ribs 123 of adjacent partitioned masks 121, which may be continuously arranged in a line in the Y direction.

The fixing unit 140 may be attached to the supporter 130. The fixing unit 140 may be coupled to the bending units 132 at opposing ends of the supporter 130, and may be coupled to the supporter 130 by at least one coupling unit 160. The fixing unit 140 may include separate units adjacent opposing frame sides, e.g., frame sides 113 and 114. Each unit of the fixing unit 140 may have a rectangular shape and may be disposed in the X direction, which is a direction intersecting the direction in which the supporter 130 is disposed.

A plurality of coupling holes 141 may be formed in the fixing unit 140 at positions corresponding to the bending units 132. The coupling holes 141 may be separated by a predetermined distance, and may extend along a length of the fixing unit 140. The coupling units 160 may secure the supporter 130 to the fixing unit 140 by coupling with the coupling hole 133 in the bending unit 132 through the coupling hole 141 of the fixing unit 140. The coupling unit 160 may be any suitable fastener, e.g., a bolt or a screw.

Opposing ends of the fixing unit 140 may be connected to the first frame side 111 and the second frame side 112. The first frame side 111 and the second frame side 112 may each include a gap control unit 170 defined, at least partially, by a thickness of the first and second frame sides 111 and 112, respectively. The gap control unit 170 may facilitate coupling the supporter 130 to the fixing unit 140 by, for example, providing sufficient space in which to dispose the bending unit 132. In other words, the gap control unit 170 may facilitate separating the fixing unit 140, by a predetermined gap g, from the third frame 113 and the fourth frame 114 in a Z direction. The gap g between the fixing unit 140 and the third and fourth frames 113 and 114 may define the space in which the bending unit 132 may be disposed. Therefore, the first frame 111 and the second frame 112 may have a thickness as large as the gap g.

Accordingly, the gap control unit 170 may be formed under the first frame 111 and the second frame 112. As described above, the gap control unit 170 may be formed by forming the first frame 111 and the second frame 112 with a thickness greater than that of the third frame 113 and the fourth frame 114 to maintain the gap g under the first frame 111 and the second frame 112. The first and second frames 111 and 112 (having a thickness different from that of the third and fourth frames 113 and 114) may be formed by using a press processing.

Coupling grooves 171 may be formed on opposing ends of each of the first frame 111 and the second frame 112. Two or more of the coupling holes 141 may correspond in position to the coupling grooves 171 formed in the first and second frames 111 and 112.

The coupling holes 141 in the fixing unit 140 may be aligned with the coupling holes 133 in the bending units 132. The coupling unit 160 may then be used to secure the supporter 130 to the fixing unit 140 and opposing ends of the fixing unit 140 to the first frame 111 and the second frame 112.

When the supporter 130 is not required to support the mask 120, the supporter 130 and the fixing unit 140 may be separated from the mask frame 110 by removing the coupling unit 160.

According to some embodiments, the gap control unit 170 may be formed by configuring the first frame 111 and the second frame 112 to have an increased thickness, e.g., a thickness greater than that of the third frame 113 and the fourth frame 114. However, the gap control unit 170 is not limited thereto, and may be any suitable structure that may serve to define a space in which to position the bending units 132 when the supporting unit 130 is coupled to the fixing unit 140.

For example, according to some embodiments, the thicknesses of opposing ends of the first frame 111 and the second frame 112 may be greater than remaining portions of the first frame 111 and the second frame 112, and the gap control unit 170 could be defined simply by the thicker end portions. According to some embodiments, an additional panel member may be attached to lower surfaces of the first frame 111 and the second frame 112. According to some embodiments, opposing ends of the fixing unit 140 may be bent in a direction towards the first frame 111 and the second frame 112.

The supporting unit 130 and the fixing unit 140 may be formed of the same material, in order to minimize thermal deformation of the supporting unit 130 and the fixing unit 140.

Figure 4:
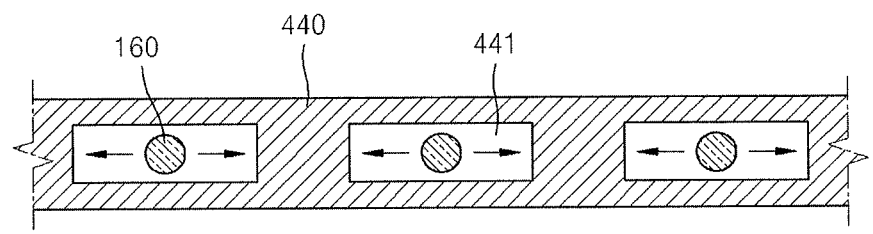
FIG. 4 illustrates a plan view of a fixing unit according to another embodiment.
Figure 5:
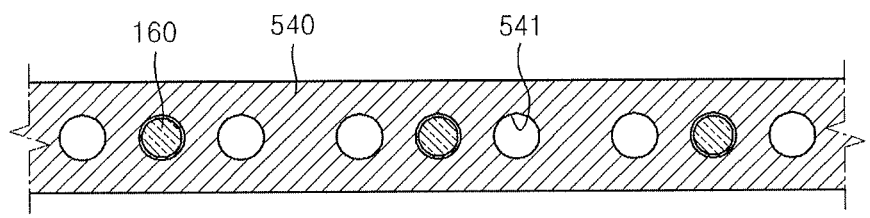
FIG. 5 illustrates a plan view of a fixing unit according to another embodiment.
Figure 6:
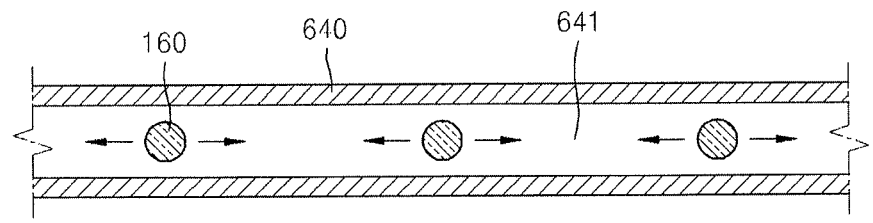
FIG. 6 illustrates a plan view of a fixing unit according to another embodiment.

FIGS. 4 through 6 illustrate plan views of modified fixing units, according to another embodiment.

Referring to FIG. 4, a fixing unit 440 may include a plurality of coupling holes 441. The coupling holes 141 illustrated in FIG. 2 may optionally be disposed at positions corresponding to the bending units 132 of the supporter 130. However, unlike the coupling holes 141 in FIG. 2, the coupling holes 441, according to some embodiments, may be configured to allow the coupling unit 160 to move or change its position left and right, e.g., horizontally, along a length direction of the fixing unit 440. In a horizontal cross-sectional view of the coupling holes 441, the coupling holes 441 may have a rectangular shape.

Accordingly, when the bending units 132 of the supporter 130 are positioned on the fixing unit 440, the coupling unit 160 move its position left and right, e.g., horizontally, within the coupling holes 441, and may be coupled to the coupling holes 133 formed in the bending units 132. Thus, the supporter 130 may be secured to the fixing unit 440.

The coupling holes 441 in the fixing unit 440 may be at positions corresponding to the coupling grooves 171 in the gap control unit 170 (refer to FIG. 2). The coupling unit 160 may secure the first frame 111 and the second frame 112 to the fixing unit 440.

Referring to FIG. 5, a fixing unit 540 may include a plurality of coupling holes 541. The coupling holes 541 may be separated by predetermined gaps along the length direction of the fixing unit 540. The coupling holes 141 in FIG. 2 may be optionally be formed in the fixing unit 140 at positions corresponding to the bending units 132 of the supporter 130. However, unlike the coupling holes 141 in FIG. 2, according to some embodiments, the coupling holes 541 in the fixing unit 540 may be greater in number than the coupling holes 541 of the supporting units 131.

Accordingly, when the bending units 132 of the supporter 130 are aligned with the fixing unit 540, the coupling unit 160, e.g., a screw, may secure the supporter 130 to the fixing unit 540 by coupling with the coupling holes 541 formed in the fixing unit 540 at positions corresponding to the bending units 132 of the supporter 130.

The coupling holes 541 in the fixing unit 540 may be at positions corresponding to the coupling grooves 171 formed in the gap control unit 170. Thus, the fixing unit 540 may be secured to the first frame 111 and the second frame 112 by the coupling unit 160.

Referring to FIG. 6, a fixing unit 640 may include a plurality of coupling holes 641. Each of the coupling holes 641 may be a large hole or opening that extends along a length direction of the fixing unit 640.

Accordingly, the bending units 132 of the supporter 130 may be aligned with the fixing unit 640, and the coupling unit 160 may be moved left and right, e.g., horizontally, within the coupling holes 641 to secure the supporter 130 to the fixing unit 640.

The coupling holes 641 may be positioned in the fixing unit 640 at locations corresponding to the position of the coupling grooves 171 formed in the gap control unit 170. Thus, the fixing unit 640 may be coupled to the first frame 111 and the second frame 112 by the coupling unit 160.

Figure 7:
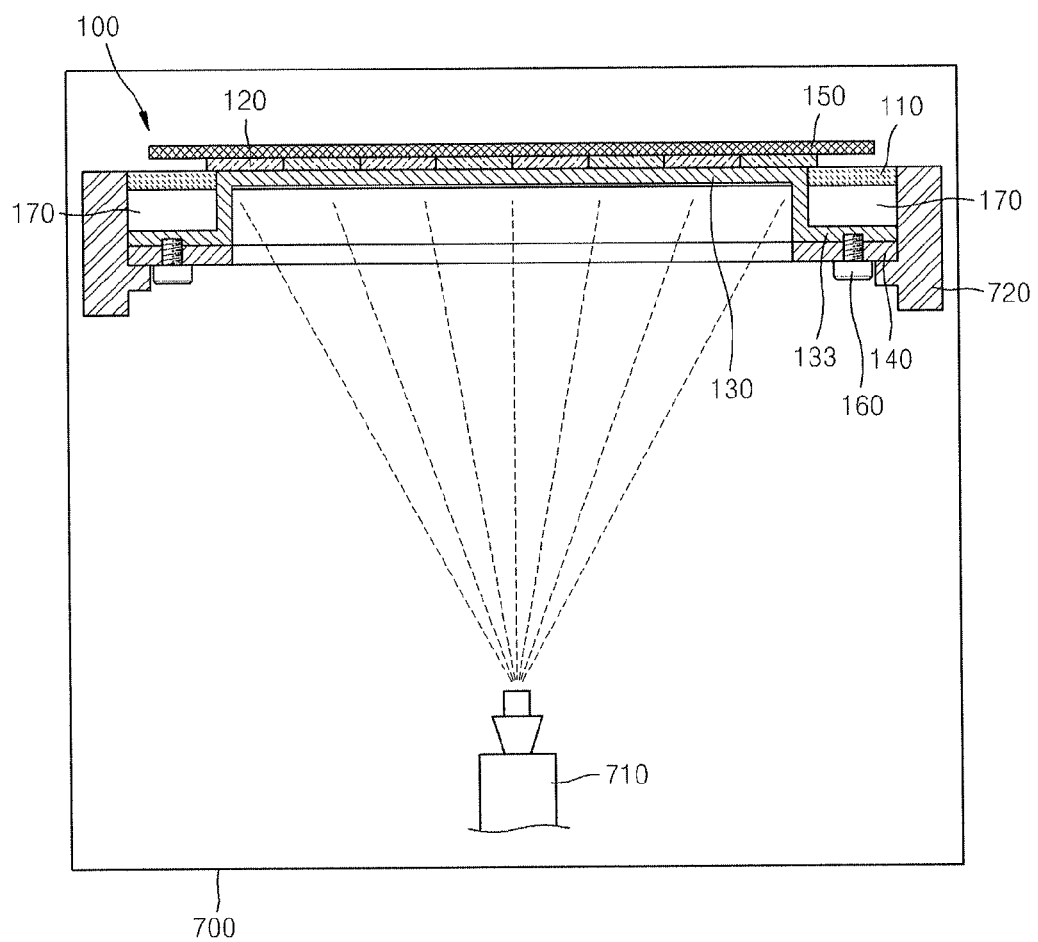
FIG. 7 illustrates a schematic cross-sectional view taken along a line VII-VII of FIG. 1 for showing a state of deposition on a substrate mounted on the mask frame assembly for thin film deposition.

FIG. 7 illustrates a schematic cross-sectional view taken along a line VII-VII of FIG. 1 for showing a state of deposition on the substrate 150 mounted on the mask frame assembly 100.

Referring to FIG. 7, in order to deposit an organic light-emitting layer or a cathode electrode of an organic light-emitting display apparatus by using the mask frame assembly 100, a vacuum chamber 700 may be provided. A deposition source 710 may be positioned on a lower side of the vacuum chamber 700, and the mask frame assembly 100 may be installed above the deposition source 710 in the vacuum chamber 700. The substrate 150 may be disposed on the mask 120. The vacuum chamber 700 may further include an additional supporting member 720 positioned adjacent opposing edges of the mask frame assembly 100 for supporting the mask frame assembly 100.

A process of depositing a material at desired locations on the substrate 150 will be briefly described.

First, the mask frame assembly 100 may be positioned on the supporting member 720 and secured thereto. The substrate 150 may then be disposed on the mask 120. The substrate 150 may be disposed directly on the mask 120 without leaving a gap therebetween, or a predetermined gap may be provided between the substrate 150 and the mask 120 by an additional gap control unit in the mask frame assembly 100.

Next, a deposition material may be ejected towards the mask frame assembly 100 from the deposition source 710 located on the lower side of the vacuum chamber 700. Then, the deposition pattern units 122 (refer to FIG. 1) formed on the mask 120 may deposit the deposition material in a desired pattern on a surface of the substrate 150.

During the deposition process, a central portion of the substrate 150 may bend towards the deposition source 710 due to the weight of the substrate 150. However, lower parts of the mask 120, e.g., a lower surface of the mask 120, may be supported by the supporter 130. Also, the supporter 130 may be coupled to the fixing unit 140, and the fixing unit 140 may be coupled to the gap control unit 170. Accordingly, a weight applied to the substrate 150 may be distributed by the supporter 130. Therefore, damage to the substrate 150 and the deformation of the mask 120 may be prevented.

Figure 8:
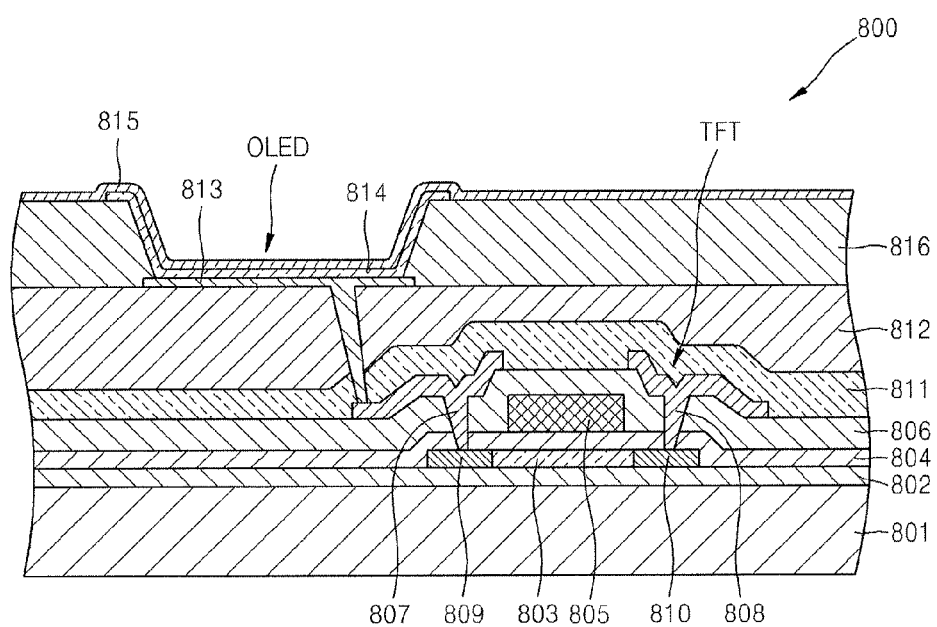
FIG. 8 illustrates a schematic cross-sectional view of an organic light-emitting display apparatus deposited by using the mask frame assembly according to an embodiment.

FIG. 8 illustrates a schematic cross-sectional view of a sub-pixel of an organic light-emitting display apparatus 800 deposited by using the mask frame assembly 100 according to an embodiment.

The sub-pixel includes at least one thin-film transistor (TFT) and an organic light-emitting display (OLED). The structure of a TFT according to embodiments may not be limited to the TFT of FIG. 8. In other words, the number and structure of TFTs may be modified.

Referring to FIG. 8, a buffer layer 802 may be formed on a substrate 801. The substrate 801 may be formed of glass or plastic. A semiconductor active layer 803 having a predetermined pattern may be formed on the buffer layer 802. A gate insulating film 804 may be formed on the semiconductor active layer 803. A gate electrode 805 may be formed on a predetermined region of the gate insulating film 804.

The gate electrode 805 may be connected to a gate line (not shown) that applies an on/off signal to the TFT. An interlayer insulating film 806 may be formed on the gate electrode 805, and a source electrode 807 and a drain electrode 808 may be formed to be connected to a source region 809 and a drain region 810, respectively, of the semiconductor active layer 803 through contact holes.

A passivation film 811 including $SiO_2$ or $SiNx$ may be formed on the source electrode 807 and the drain electrode 808. A planarization film 812 including an organic material such as acryl, polyimide, or benzocyclobutene (BCB) may be formed on the passivation film 811.

A pixel electrode 813 that is an anode of an OLED may be formed on the planarization film 812, and a pixel defining layer (PDL) 816 covering the pixel electrode 813 may be formed using an organic material. After forming a predetermined opening in the PDL 816, an organic film 814 may be formed on the PDL 816 and the pixel electrode exposed through the opening. The organic film 814 may include a light emitting layer. However, the structure of an OLED apparatus according to the embodiments, is not limited thereto, and various structures of the OLED apparatus may be provided.

An OLED may display a predetermined image by emitting light of red, green, and blue in response to a current flow, and may include the pixel electrode 813 as a first electrode that is connected to the source electrode 807 of the TFT to receive a plus power from the source electrode 807, a counter electrode 815 as a second electrode that covers the entire pixel and supplies a minus power to the OLED, and the organic film 814 disposed between the pixel electrode 813 and the counter electrode 815 to emit light.

The pixel electrode 813 and the counter electrode 815 may be insulated from each other by the organic film 814, and may apply voltages having different polarities from each other to the organic film 814 so that the organic film 814 emits light.

The counter electrode 815 may function as an anode, and the pixel electrode 813 may function as a cathode. The polarities of the pixel electrode 813 and the counter electrode 815 may be reversed.

The pixel electrode 813 may be formed as a transparent electrode or a reflective electrode. When the pixel electrode 813 is to be formed as a transparent electrode, the pixel electrode 813 may be formed of a material from the group of ITO, IZO, ZnO, and $In_2O_3$. When the pixel electrode 813 is to be fainted as a reflective electrode, a reflective film using a material selected from the group consisting of Ag, Mg, Al, Pt, Pd, Au, Ni, Nd, Ir, Cr, and a compound of these metals may be formed, and ITO, IZO, ZnO, and $In_2O_3$ may then be formed on the reflective film.

The counter electrode 815 may also be formed as a transparent electrode or a reflective electrode. When the counter electrode 815 is to be formed as a transparent electrode, the counter electrode 815 may function as a cathode. Thus, after depositing a metal having a low work function, such as Li, Ca, LiF/Ca, LiF/Al, Al, Ag, Mg, and a compound of these metals in a direction towards the organic film 814, an auxiliary electrode layer or a bus electrode line may be formed on the resultant structure using a transparent electrode material such as ITO, IZO, ZnO, or $In_2O_3$. When the counter electrode 815 is to be formed as a reflective electrode, the counter electrode 815 may be formed by entirely depositing a metal such as Li, Ca, LiF/Ca, LiF/Al, Al, Ag, Mg, and a compound of these metals.

When the pixel electrode 813 is formed as the transparent electrode or the reflective electrode, the pixel electrode 813 may be formed in a shape corresponding to the shape of the opening of each of the sub-pixels. Also, the counter electrode 815 may be formed by depositing the transparent electrode or the reflective electrode on an entire display region. However, the counter electrode 815 may not necessarily be deposited on an entire surface of the display region, but may be formed in various patterns. The pixel electrode 813 and the counter electrode 815 may be stacked in reverse order, according to some embodiments.

The organic film 814 may be a low molecular weight organic film or a polymer organic film. When the organic film 814 is a low molecular weight film, the organic film 814 may be a Hole Injection Layer (HIL), a Hole Transport Layer (HTL), an Emission Layer (EML), an Electron Transport Layer (ETL), an Electron Injection Layer (EIL) or a combination of these layers and may be composed of copper phthalocyanine (CuPc), N,N'-Di(naphthalene-1-yl)-N,N'-diphenyl-benzidine (NPB), or tris-8-hydroxyquinoline aluminum (Alq3). The low molecular weight organic film may be formed using an evaporation method.

The organic film 814 may be a low molecular weight organic film or a polymer organic film. If the organic film 814 is a low molecular weight organic film, the organic film 814 may be formed by stacking a hole injection layer (HIL), a hole transport layer (HTL), an emission layer (EML), an electron transport layer (ETL), or an electron injection layer (EIL) in a single structure or a composite structure. The organic film 814 may include various materials including, but not limited to, copper phthalocyanine (CuPc), N,N'-di(naphthalene-1-yl)-N,N-diphenyl-benzidine (NPB), or tris-8-hydroxyquinoline aluminum ($Alq_3$). The low molecular weight organic film may be formed using a vacuum evaporation method.

If the organic film 814 is a high molecular weight organic film, the organic film 814 may generally include an HTL and an EML. The HTL may include poly-(2,4)-ethylene-dihydroxy thiophene (PEDOT) and the EML may include a polymer organic material, such as poly-phenylenevinylene (PPV)

or polyfluorene. The HTL and the EML may be formed using a screen printing method or an inkjet printing method. However, the organic film 814 according to embodiments is not limited thereto, and various embodiments may be applied.

As described above, the thin-film mask assembly for thin-film deposition, according to embodiments may provide at least the advantages set forth below.

First, the thin-film mask assembly may prevent a substrate for deposition from breakage that may result from the weight of the substrate.

Second, the thin-film mask assembly may prevent a shadow phenomenon that may occur from sagging of the substrate for deposition due to a gap between a mask frame and the substrate.

Third, the thin-film mask assembly may reduce occurrence of dents in the mask patterns that result from repeated alignments due to the sagging of the substrate.

Fourth, the thin-film mask assembly may prevent variation of the position of the pattern that may occur as a result of the sagging of the substrate for deposition.

Embodiments may provide a mask frame assembly for thin-film deposition that has an improved structure for preventing a mask from sagging that may result from the weight of a substrate for deposition. The mask frame assembly may include a supporter that supports the mask and a fixing unit that fixes the supporter.

While embodiments have been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A mask frame assembly for thin-film deposition, the mask frame assembly comprising:
   a mask frame having an opening defined therethrough, the mask frame configured to retain a mask;
   at least one supporter configured to contact the mask for supporting the mask; and
   a fixing unit coupled to the supporter and the mask frame, the fixing unit being positioned substantially perpendicularly to the supporter,
   wherein the mask frame includes a first pair of parallel and opposing frame sides and a second pair of parallel and opposing pair of frame sides, the second pair of frame sides extending between and connecting the first pair of frame sides,
   wherein opposing ends of the fixing unit are coupled to the first pair of frame sides such that the fixing unit is substantially parallel to the second pair of frame sides, and
   wherein the first pair of frame sides includes a gap control unit that separates the fixing unit from at least one of the second pair of frame sides by a predetermined gap g.

2. The mask frame assembly of claim 1, wherein the supporter extends across the opening of the mask frame.

3. The mask frame assembly of claim 2, wherein the supporter includes supporting units extending under the mask and bending units extending from opposing ends of the supporting units, the bending units including at least one bent portion extending below each of the ends of the supporting units.

4. The mask frame assembly of claim 3, wherein
   the fixing unit is aligned with the bending units of the supporter,
   at least one coupling unit is coupled to the supporter and the fixing unit, for coupling the supporter and the fixing unit to each other.

5. The mask frame assembly of claim 4, wherein the fixing unit includes at least one coupling hole at a position corresponding in position to a respective one of the bending units, and the at least one coupling unit is coupled to a coupling hole in the bending unit.

6. The mask frame assembly of claim 5, wherein the fixing unit comprises a plurality of coupling holes, separated from each other, along a length of the fixing unit at positions corresponding to the bending units, and the at least one coupling unit includes a plurality of coupling units, the plurality of coupling units being coupled to the bending units of the supporter through the coupling holes of the fixing unit.

7. The mask frame assembly of claim 5, wherein the fixing unit includes a plurality of the coupling holes, separated from each other, along the length of the fixing unit, and the plurality of the coupling holes are each configured to permit the at least one coupling unit to couple with a respective one of the bending units by movement of the coupling unit within a respective one of the coupling holes.

8. The mask frame assembly of claim 5, wherein the coupling holes of the fixing unit are greater in number than the number of the supporters, and the at least one coupling unit is coupled to a respective one of the bending units through the coupling hole of the fixing unit.

9. The mask frame assembly of claim 5, wherein each of the coupling holes extend along the length of the fixing unit and is configured to permit movement of the coupling unit therein, the coupling unit being coupled to the coupling hole of a respective one of the bending units and the coupling hole of the fixing unit.

10. The mask frame assembly of claim 4, wherein the gap corresponds to a space in which the bending units are laterally disposed when the supporter is coupled to the fixing unit.

11. The mask frame assembly of claim 10, wherein the gap control unit is defined by a thickness of the first pair of frame sides, the thickness of the first pair of frame sides being greater than a thickness of the second pair of frame sides.

12. The mask frame assembly of claim 10, further including coupling holes at opposing ends of the fixing unit corresponding in position to coupling grooves in the gap control unit, wherein the coupling units are coupled to the coupling grooves in the gap control unit and the coupling holes at the opposing ends of the fixing unit.

13. The mask frame assembly of claim 1, wherein the mask includes deposition pattern units spaced apart from each other along a length of the mask, and a plurality of ribs extend between and connect adjacent deposition pattern units.

14. The mask frame assembly of claim 13, wherein the supporter units are disposed across the opening, and under the ribs.

15. The mask frame assembly of claim 14, wherein the directions in which the mask and the supporter are disposed intersect each other.

16. The mask frame assembly of claim 1, wherein the first pair of frame sides and the second pair of frame sides surround the opening.

17. The mask frame assembly of claim 16, wherein the supporter is disposed parallel to the first pair of frame sides across the opening.

18. The mask frame assembly of claim 17, wherein opposing ends of the supporter include bending units having at least one bent portion, the bending units being disposed on the fixing unit, the supporter and the fixing unit being coupled to each other by at least one coupling unit, and opposing ends of the fixing unit being coupled to the first pair of frame sides.

19. The mask frame assembly of claim 18, wherein the fixing unit includes coupling holes at positions corresponding to the position of the bending units of the supporter, and a plurality of the coupling units are coupled to the coupling holes in the bending units of the supporter.

20. The mask frame assembly of claim 19, wherein the gap defines a space in which the bending units are laterally disposed.

21. The mask frame assembly of claim 20, wherein the gap control unit is defined by a thickness of the first pair of frame sides, the thickness of the first pair of frame sides being greater than the thickness of the second pair of frame sides.

22. The mask frame assembly of claim 20, wherein opposing ends of the fixing unit further include coupling holes at positions corresponding to coupling grooves in the gap control unit, and the coupling unit is coupled to the coupling grooves in the gap control unit through the coupling holes.

23. The mask frame assembly of claim 1, wherein the mask includes at least one partitioned mask extending across the opening.

24. A mask frame assembly for thin-film deposition, the mask frame assembly comprising:
   a mask frame having an opening defined therethrough, the mask frame configured to retain a mask;
   at least one supporter configured to contact the mask for supporting the mask; and
   a fixing unit coupled to the supporter and the mask frame,
   wherein the supporter extends across the opening of the mask frame,
   wherein the supporter includes supporting units extending under the mask and bending units extending from opposing ends of the supporting units, the bending units including at least one bent portion extending below each of the ends of the supporting units,
   the mask frame includes a first pair of parallel and opposing frame sides and a second pair of parallel and opposing pair of frame sides extending between and connecting the first pair of parallel and opposing frame sides,
   the fixing unit is aligned with the bending units of the supporter,
   at least one coupling unit is coupled to the supporter and the fixing unit, for coupling the supporter and the fixing unit to each other,
   opposing ends of the fixing unit are coupled to the first pair of frame sides,
   wherein the fixing unit includes at least one coupling hole at a position corresponding in position to a respective one of the bending units, and the at least one coupling unit is coupled to a coupling hole in the bending unit, and
   wherein the fixing unit comprises a plurality of coupling holes, separated from each other, along a length of the fixing unit at positions corresponding to the bending units, and the at least one coupling unit includes a plurality of coupling units, the plurality of coupling units being coupled to the bending units of the supporter through the coupling holes of the fixing unit.

25. The mask frame assembly of claim 24, wherein the coupling holes of the fixing unit are greater in number than the number of the supporters, and the at least one coupling unit is coupled to a respective one of the bending units through the coupling hole of the fixing unit.

26. A mask frame assembly for thin-film deposition, the mask frame assembly comprising:
   a mask frame having an opening defined therethrough, the mask frame configured to retain a mask;
   at least one supporter configured to contact the mask for supporting the mask; and
   a fixing unit coupled to the supporter and the mask frame,
   wherein the supporter extends across the opening of the mask frame,
   wherein the supporter includes supporting units extending under the mask and bending units extending from opposing ends of the supporting units, the bending units including at least one bent portion extending below each of the ends of the supporting units,
   the mask frame includes a first pair of parallel and opposing frame sides and a second pair of parallel and opposing pair of frame sides extending between and connecting the first pair of parallel and opposing frame sides,
   the fixing unit is aligned with the bending units of the supporter,
   at least one coupling unit is coupled to the supporter and the fixing unit, for coupling the supporter and the fixing unit to each other,
   opposing ends of the fixing unit are coupled to the first pair of frame sides,
   wherein the first pair of frame sides include a gap control unit for maintaining a gap corresponding corresponds to a space in which the bending units are disposed when the supporter is coupled to the fixing unit, and
   the mask frame assembly further including coupling holes at opposing ends of the fixing unit corresponding in position to coupling grooves in the gap control unit, wherein the coupling units are coupled to the coupling grooves in the gap control unit and the coupling holes at the opposing ends of the fixing unit.

27. The mask frame assembly of claim 1, wherein fixing unit includes first and second separate units, the first and second units being coupled to opposing ends of the supporter,
   wherein opposing ends of the fixing unit are coupled to a first end of the first pair of frame sides, and opposing ends of the second unit are coupled to a second end of the first pair of frame sides, such that each of the first and second units is substantially parallel to each of the second pair of frame sides, respectively, and
   wherein the gap control unit separates the first and second units from each of the second pair of frame sides, respectively, by first and second predetermined gaps g.

* * * * *